(12) United States Patent
Lam

(10) Patent No.: US 8,748,753 B2
(45) Date of Patent: Jun. 10, 2014

(54) PRINTED CIRCUIT BOARD

(75) Inventor: Fuk Ming Lam, Hong Kong (HK)

(73) Assignee: SAE Magnetics (H.K.) Ltd., Hong Kong (HK)

( * ) Notice: Subject to any disclaimer, the term of this patent is extended or adjusted under 35 U.S.C. 154(b) by 232 days.

(21) Appl. No.: 13/410,311

(22) Filed: Mar. 2, 2012

(65) Prior Publication Data

US 2013/0228366 A1    Sep. 5, 2013

(51) Int. Cl.
*H05K 1/16* (2006.01)

(52) U.S. Cl.
USPC .......................................... 174/260; 174/262

(58) Field of Classification Search
USPC ................... 174/260, 262–266; 361/792–795
See application file for complete search history.

(56) References Cited

U.S. PATENT DOCUMENTS

| | | | |
|---|---|---|---|
| 6,812,803 B2 | 11/2004 | Goergen | |
| 8,243,466 B2 * | 8/2012 | Luo et al. | 361/782 |
| 2006/0108143 A1 | 5/2006 | Hsu et al. | |
| 2007/0136618 A1 * | 6/2007 | Ohsaka | 713/323 |

* cited by examiner

*Primary Examiner* — Jeremy C Norris

(57) ABSTRACT

A printed circuit board includes a first conductive layer that includes a first transmission line portion and two soldering pads, a first insulating layer disposed under the first conductive layer, a fourth conductive layer disposed under the first insulating layer and including a second transmission line portion, two through-hole vias respectively disposed across the first insulating layer, and two capacitors respectively connecting the first transmission line portion and the two soldering pads. The two through-hole vias are directly connected with the two soldering pads and extending the connection to the second transmission line portion respectively.

18 Claims, 12 Drawing Sheets

PRINTED CIRCUIT BOARD

FIELD OF THE PATENT APPLICATION

The present patent application relates to printed circuit board technologies and more particularly to a printed circuit board (PCB) with a trace configuration combining DC block capacitors and through-hole vias.

BACKGROUND

FIG. 1 is a perspective view of a conventional printed circuit board (PCB). Referring to FIG. 1, on a PCB substrate 100, two surface-mount (SMT) DC block (or ac-coupling) capacitors 101 are respectively mounted to two soldering pads 104 connected with a pair of high-speed serial transmission lines 102, which are configured to interface two high-speed logic integrated circuits (IC). Examples of logic IC interface configurations are LVDS (low-voltage differential signaling) and CML (current mode logic). Meanwhile, because of the limited size of the PCB 100, plated through-hole (PTH) vias 103 are needed to connect signals in the top layer to the bottom (or vice versa). The presence of both DC block capacitors 101 and PTH vias 103 in the high-speed transmission lines 102 and 105 introduces discontinuities to high-speed electrical signals running on the PCB traces, which often changes the characteristic impedance along the traces and causes a considerable amount of signal reflections. Thereby, the signal quality in the transmission lines is degraded.

SUMMARY

The present patent application is directed to a printed circuit board (PCB). In one aspect, the printed circuit board includes a first conductive layer, a first insulating layer disposed under the first conductive layer, a second conductive layer disposed under the first insulating layer, a second insulating layer disposed under the second conductive layer, a third conductive layer disposed under the second insulating layer, a third insulating layer disposed under the third conductive layer, a fourth conductive layer disposed under the third insulating layer, two through-hole vias and two ground vias respectively disposed across the first insulating layer, the second conductive layer, the second insulating layer, the third conductive layer, and the third insulating layer, and two capacitors. The first conductive layer includes a first transmission line portion, two soldering pads, and two first stubs. The fourth conductive layer includes two connecting portions, two second stubs, and a second transmission line portion directly connected to the two connecting portions. The two capacitors are respectively connecting the first transmission line portion and the two soldering pads. The two through-hole vias are directly connected with the two soldering pads and extending the connection to the two connecting portions respectively. The two ground vias are physically and electrically connected with the two first stubs and the two second stubs, and physically and electrically connected with the second conductive layer and the third conductive layer respectively. Two windows are respectively defined in the second conductive layer and the third conductive layer in the vicinity of where the through-hole vias pass through so that the through-hole vias are physically and electrically isolated from the second conductive layer and the third conductive layer.

The two capacitors may be surface mount DC block capacitors. The second and the third conductive layers may be layers of the electrical ground level with respect to the transmission line portions.

The first conducting layer may further include two additional soldering pads being disposed at an end of the first transmission line portion, and configured to physically and electrically connect the first transmission line portion and the capacitors.

The soldering pads in the first conductive layer and the connecting portions in the fourth conductive layer may be respectively merged into end portions of the through-hole vias. The end portions of the through-hole vias may be circular pads.

The edge-to-edge separation between the soldering pads in the first conductive layer may be 0.2 mm to 0.3 mm. The thickness of the first, the second, and the third insulating layers may be 0.1 mm or less.

In another aspect, the printed circuit board includes a first conductive layer, a first insulating layer disposed under the first conductive layer, a second conductive layer disposed under the first insulating layer, a second insulating layer disposed under the second conductive layer, a third conductive layer disposed under the second insulating layer, a third insulating layer disposed under the third conductive layer, a fourth conductive layer disposed under the third insulating layer, two through-hole vias respectively disposed across the first insulating layer, the second conductive layer, the second insulating layer, the third conductive layer, and the third insulating layer, and two capacitors. The first conductive layer includes a first transmission line portion and two soldering pads. The fourth conductive layer includes two connecting portions and a second transmission line portion directly connected to the two connecting portions. The two capacitors are respectively connecting the first transmission line portion and the two soldering pads. The two through-hole vias are directly connected with the two soldering pads and extending the connection to the two connecting portions respectively. Two windows are respectively defined in the second conductive layer and the third conductive layer in the vicinity of where the through-hole vias pass through so that the through-hole vias are electrically isolated from the second conductive layer and the third conductive layer.

The first and the second transmission line portions may be differential pairs of microstrip lines. The PCB may further include at least two ground vias respectively disposed across the second insulating layer, and physically and electrically connected with the second conductive layer and the third conductive layer. The first conductive layer may further include at least two first stubs, the fourth conductive layer may further include at least two second stubs, and the at least two ground vias are respectively disposed across the first insulating layer, the second conductive layer, the third conductive layer, and the third insulating layer, and electrically connected with the at least two first stubs and the at least two second stubs.

The first and the second transmission line portions may be coplanar waveguides, respectively including a top surface ground plane and a bottom surface ground plane. The PCB may further include at least two ground vias respectively disposed across the first insulating layer, the second conductive layer, the second insulating layer, the third conductive layer, and the third insulating layer, and electrically connected with the top surface ground plane, the bottom surface ground plane, the second conductive layer, and the third conductive layer.

The two capacitors may be surface mount DC block capacitors. The second and the third conductive layers may be layers of the electrical ground level with respect to the transmission line portions.

The soldering pads in the first conductive layer and the connecting portions in the fourth conductive layer may be respectively merged into end portions of the through-hole vias. The end portions of the through-hole vias may be circular pads.

The edge-to-edge separation between the soldering pads in the first conductive layer may be 0.2 mm to 0.3 mm. The thickness of the first, the second, and the third insulating layers may be 0.1 mm or less.

In yet another aspect, the printed circuit board includes a first conductive layer that includes a first transmission line portion and two soldering pads, a first insulating layer disposed under the first conductive layer, a fourth conductive layer disposed under the first insulating layer and including a second transmission line portion, two through-hole vias respectively disposed across the first insulating layer, and two capacitors respectively connecting the first transmission line portion and the two soldering pads. The two through-hole vias are directly connected with the two soldering pads and extending the connection to the second transmission line portion respectively.

The PCB may further include a second conductive layer disposed under the first insulating layer, a second insulating layer disposed under the second conductive layer, a third conductive layer disposed under the second insulating layer, and a third insulating layer disposed under the third conductive layer. Two windows may be respectively defined in the second conductive layer and the third conductive layer in the vicinity of where the through-hole vias pass through so that the through-hole vias are electrically isolated from the second conductive layer and the third conductive layer.

The first and the second transmission line portions may be coplanar waveguides, respectively including a top surface ground plane and a bottom surface ground plane. The PCB may further include at least two ground vias respectively disposed across the first insulating layer, and electrically connected with the top surface ground plane and the bottom surface ground plane.

The soldering pads in the first conductive layer and the second transmission line portion in the fourth conductive layer may be respectively merged into end portions of the through-hole vias. The end portions of the through-hole vias may be circular pads.

The edge-to-edge separation between the soldering pads in the first conductive layer may be 0.2 mm to 0.3 mm. The thickness of the first layer may be 0.1 mm or less.

BRIEF DESCRIPTIONS OF THE DRAWINGS

DETAILED DESCRIPTION

Reference will now be made in detail to a preferred embodiment of the PCB disclosed in the present patent application, examples of which are also provided in the following description. Exemplary embodiments of the PCB disclosed in the present patent application are described in detail, although it will be apparent to those skilled in the relevant art that some features that are not particularly important to an understanding of the PCB may not be shown for the sake of clarity.

Furthermore, it should be understood that the PCB disclosed in the present patent application is not limited to the precise embodiments described below and that various changes and modifications thereof may be effected by one skilled in the art without departing from the spirit or scope of the protection. For example, elements and/or features of different illustrative embodiments may be combined with each other and/or substituted for each other within the scope of this disclosure.

Figure 2A:
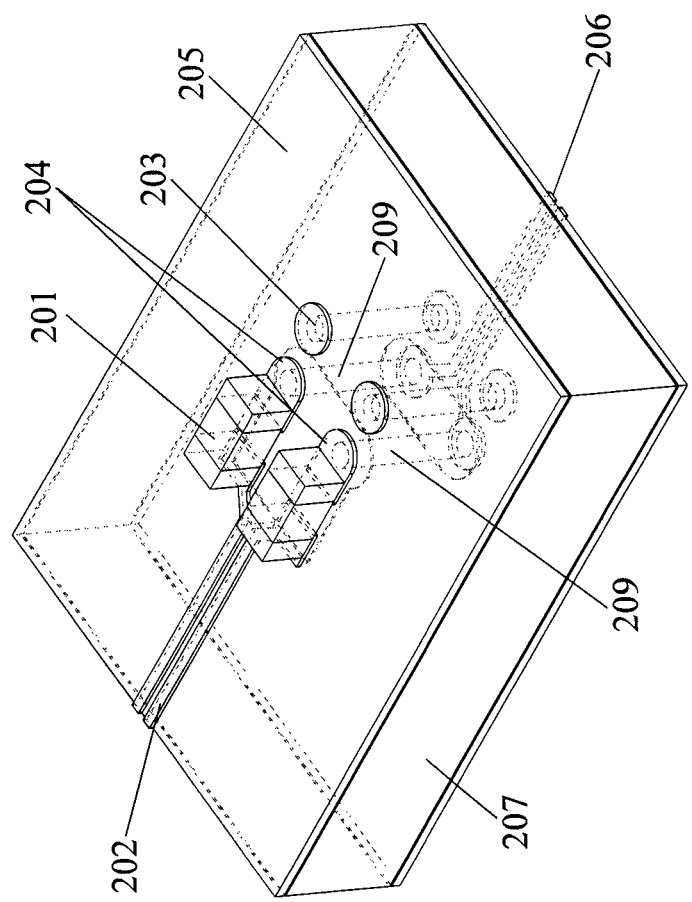
FIG. 2A is a perspective view of a PCB according to an embodiment of the present patent application.
Figure 2B:
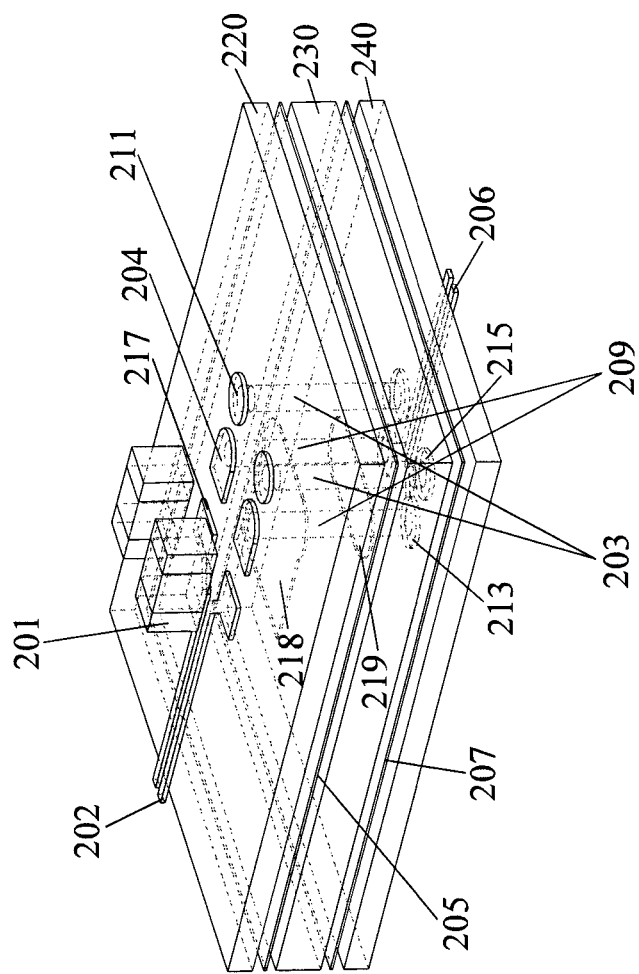
FIG. 2B is an exploded view of the PCB depicted in FIG. 2A.
Figure 2C:
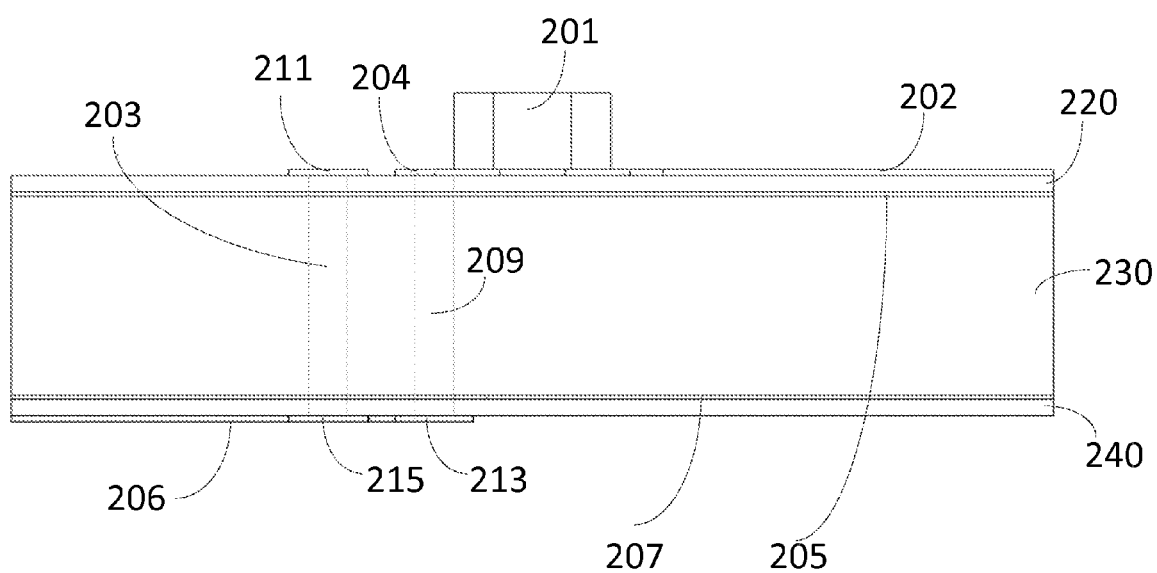
FIG. 2C is a cross-sectional view of the PCB depicted in FIG. 2A.

FIG. 2A is a perspective view of a PCB according to an embodiment of the present patent application. FIG. 2B is an exploded view of the PCB depicted in FIG. 2A. FIG. 2C is a cross-sectional view of the PCB depicted in FIG. 2A. Referring to FIGS. 2A-2C, the PCB includes a first conductive layer, a first insulating layer 220, a second conductive layer 205, a second insulating layer 230, a third conductive layer 207, a third insulating layer 240, a fourth conductive layer, two through hole vias 209, two ground vias 203, and two capacitors 201. The first conductive layer includes a first transmission line portion 202, two soldering pads 204, and two first stubs 211. The first insulating layer 220 is disposed under the first conductive layer. The second conductive layer 205 is disposed under the first insulating layer 220. The second insulating layer 230 is disposed under the second conductive layer 205. The third conductive layer 207 is disposed under the second insulating layer 230. The third insulating layer 240 is disposed under the third conductive layer 207. The fourth conductive layer is disposed under the third insulating layer 240 and includes two connecting portions 213, two second stubs 215, and a second transmission line portion 206 directly connected to the two connecting portions 213. The two through-hole vias 209 and the two ground vias 203 are respectively disposed across the first insulating layer 220, the second conductive layer 205, the second insulating layer 230, the third conductive layer 207, and the third insulating layer 240, yet the two through-holes vias 209 are not either physically or electrically connected to the second conductive layer 205 and the third conductive layer 207. The two capacitors 201 are respectively connecting the first transmission line portion 202 and the two soldering pads 204. The two through-hole vias 209 are directly connected with the two soldering pads 204, and extending the connection down to the two connecting portions 213 respectively. In other words, the two through-hole vias 209 are in direct physical contact with the two soldering pads 204. The direct physical contact can be realized by means such as soldering, but it is noted that there is no intermediate electrical components such as a bridging transmission line being connected between the through-hole vias 209 and the two soldering pads 204. The two ground vias 203 are physically and electrically connected with the two first stubs 211 and the two second stubs 215, and physically and electrically connected with the second conductive layer 205 and the third conductive layer 207 respectively. Two windows 218 and 219 are respectively defined in the second conductive layer 205 and the third conductive layer 207 in the vicinity of where the through-hole vias 209 pass through the second conductive layer 205 and the third conductive layer 207 so that the through-hole vias 209 are physically and electrically isolated from the second conductive layer 205 and the third conductive layer 207. It is noted that the window 218 in the second conductive layer 205 extends to the area under the soldering pads 204.

In this embodiment, the first conducting layer further includes two additional soldering pads 217 being disposed at an end of the first transmission line portion 202. The soldering pads 217 are configured to physically and electrically connect the first transmission line portion 202 and the capacitors 201.

The capacitors 201 are surface mount (SMT) DC block capacitors. The second conductive layer 205 and the third conductive layer 207 are layers of the electrical ground (GND) level with respect to the transmission line portion 201 and 206 respectively. The electrical ground mentioned here is not necessary to be the same as the ground reference of the system when it is implemented in reality. It is understood that the number of ground vias 203 may be more than two in other embodiments so that sufficient paths are provided for currents flowing to ground (GND). Accordingly, the number of the first stubs 211 and the number of the second stubs 215 may be more than two as well.

The soldering pads 204 for the DC block capacitors 201 in the first conductive layer and the connecting portions 213 in the fourth conductive layer are respectively merged into the end portions of the through-hole vias 209, while the end portions of the through-hole vias 209 are essentially circular pads. The through-hole vias 209 are conductive plated through-hole (PTH) vias punching through the PCB.

In this embodiment, the edge-to-edge separation between the soldering pads 204 is 0.2 mm to 0.3 mm while the capacitors 201 are in 0201 size (normally 0.6×0.3×0 3 mm in physical dimension). The thickness of the insulating layers 220, 230, and 240 is 0.1 mm (4.4 mil) or less.

It is understood that for a multiple layer PCB, there may be additional conductive and insulating layers disposed within the second insulating layer 230, and in that case the through-hole vias 209 and the ground vias 203 are passing through these additional layers.

In this embodiment, the combined structure reduces discontinuity along the transmission line portions 202 and 206, and therefore less signal reflection will occur. The PCB trace configuration minimizes the occupied space, without degrading high-speed electrical signal quality.

The design principle illustrated in the above embodiment can be applied to conventional planar transmission line structures. In this embodiment, the first and the second transmission line portions 202 and 206 are differential pairs of microstrip lines (MSL). It is understood that these transmission line portions may be coplanar waveguides (CPW). No special concern on PCB manufacturing process is imposed by the PCB trace configuration in this embodiment. In addition, common PCB layout techniques may still be applied to the PCB in this embodiment to further improve the performance. For example, adding slots under the soldering pads and adding ground vias.

Figure 3:
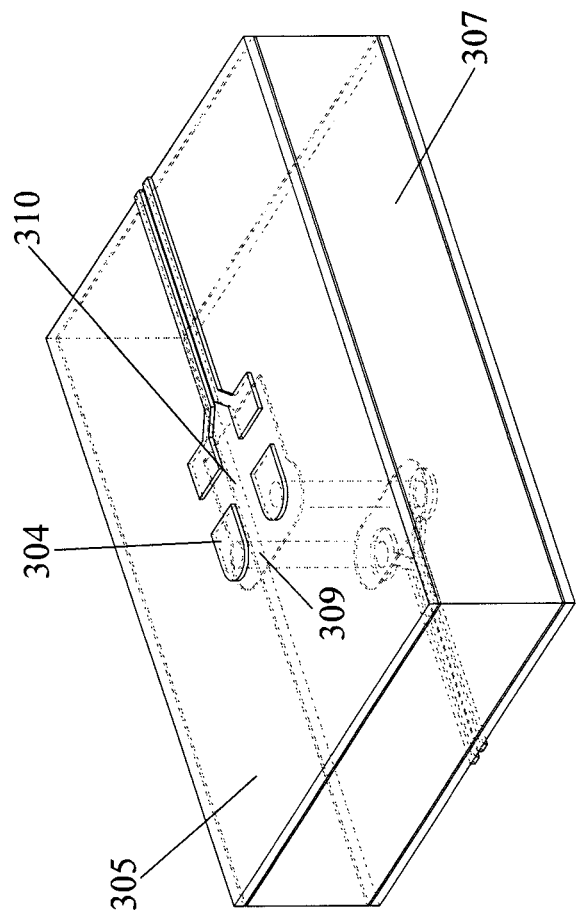
FIG. 3 is a perspective view of a PCB according to another embodiment of the present patent application.

The introduction of the ground vias 203 in this embodiment adds further improvement to the high-speed performance, because the ground vias 203 provide paths for the return-path current. It is noted, however, that in another embodiment of the present patent application, as illustrated by FIG. 3, the ground vias 203 in FIGS. 2A-2C may be omitted. In that case, a little bit of insertion loss is sacrificed, but the occupied volume of the overall structure can be further minimized.

Figure 4A:
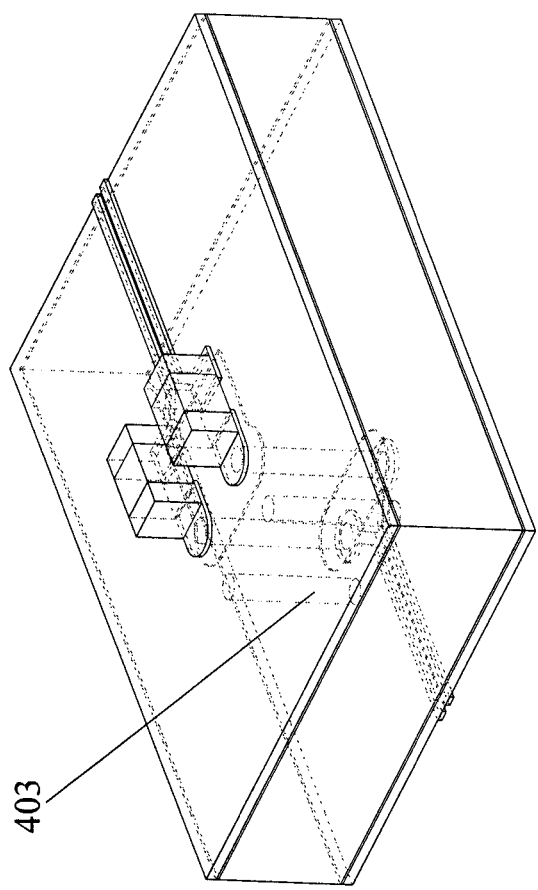
FIG. 4A is a perspective view of a PCB according to yet another embodiment of the present patent application.
Figure 4B:
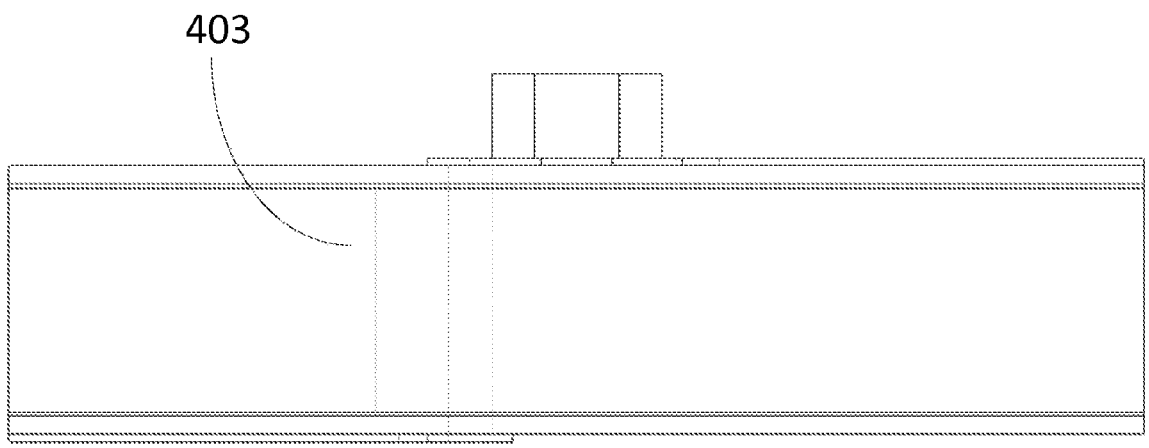
FIG. 4B is a cross-sectional view of the PCB depicted in FIG. 4A.

FIG. 4A is a perspective view of a PCB according to yet another embodiment of the present patent application. FIG. 4B is a cross-sectional view of the PCB depicted in FIG. 4A. This embodiment is similar to the embodiment illustrated by FIG. 2A, except that the stubs 211 and 215 are eliminated in this embodiment. Referring to FIG. 4A and FIG. 4B, the ground vias 403 are physically and electrically connected with the second conductive layer 205 and the third conductive layer 207, i.e. the top and the bottom GND layers, respectively, and not extending beyond the two conductive layers. It is understood that the number of ground vias in this embodiment may be more than two while all the ground vias are connected to the second and the third conductive layers 205 and 207 respectively.

Figure 5A:
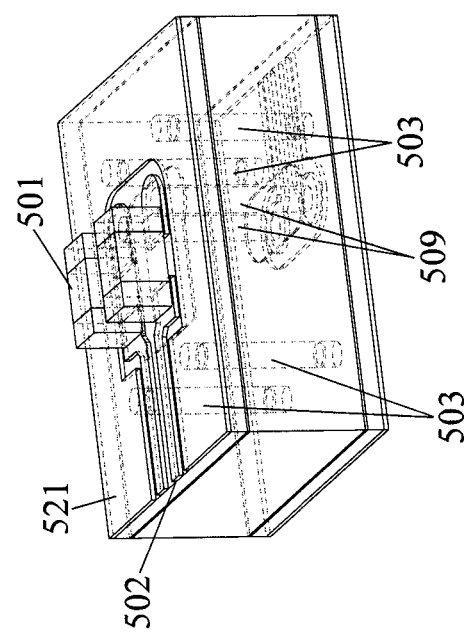
FIG. 5A is a perspective view of a PCB according to still another embodiment of the present patent application.
Figure 5B:
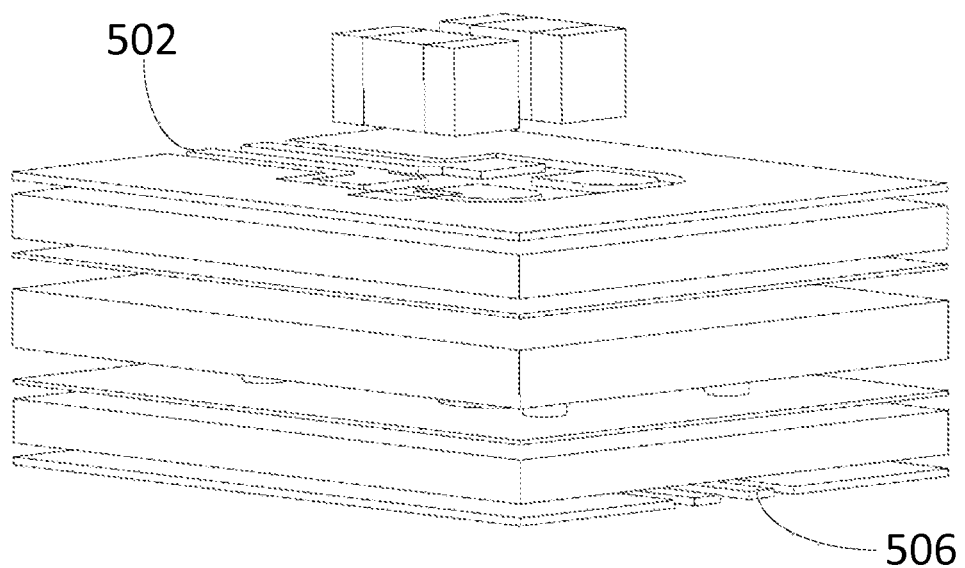
FIG. 5B is an exploded view of the PCB depicted in FIG. 5A.
Figure 5C:
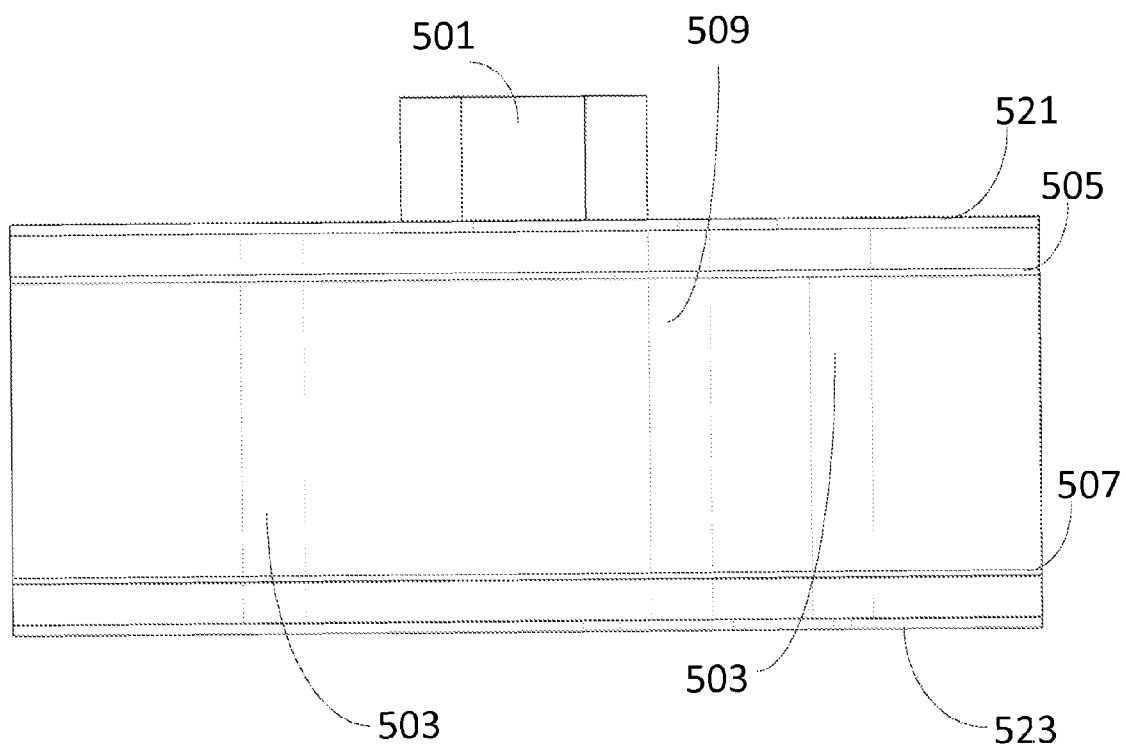
FIG. 5C is a cross-sectional view of the PCB depicted in FIG. 5A.
Figure 5D:
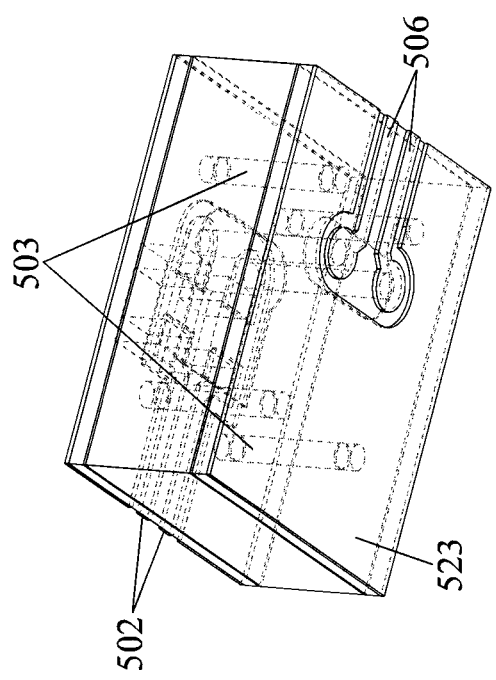
FIG. 5D is a bottom perspective view of the PCB depicted in FIG. 5A.

FIG. 5A is a perspective view of a PCB according to still another embodiment of the present patent application. FIG. 5B is an exploded view of the PCB depicted in FIG. 5A. FIG. 5C is a cross-sectional view of the PCB depicted in FIG. 5A. FIG. 5D is a bottom perspective view of the PCB depicted in FIG. 5A. Referring to FIGS. 5A-5D, this embodiment is similar to the embodiment illustrated in FIG. 2A, except for the following differences. The first and the second transmission line portions 202 and 206 are replaced by transmission line portions 502 and 506, which are connected through the capacitors 501. The transmission line portions 502 and 506 are coplanar waveguides (CPW), which include a top surface ground plane 521 and a bottom surface ground plane 523 respectively. There are two through-hole vias 509 and four ground vias 503 in this embodiment. It is understood that the number of ground vias may be other than four as long as sufficient paths are provided for currents flowing to ground (GND). In this embodiment, referring to FIG. 5C, the ground vias 503 are physically and electrically connected with the top surface ground plane 521, the bottom surface ground plane 523, the second conductive layer 505, and the third conductive layer 507 respectively.

It is understood that in this embodiment, the second conductive layer 505 and the third conductive layer 507 may be eliminated in a simplified configuration. In that case, there will be only one insulating layer disposed between the top surface ground plane 521 and the bottom surface ground plane 523.

Figure 1:
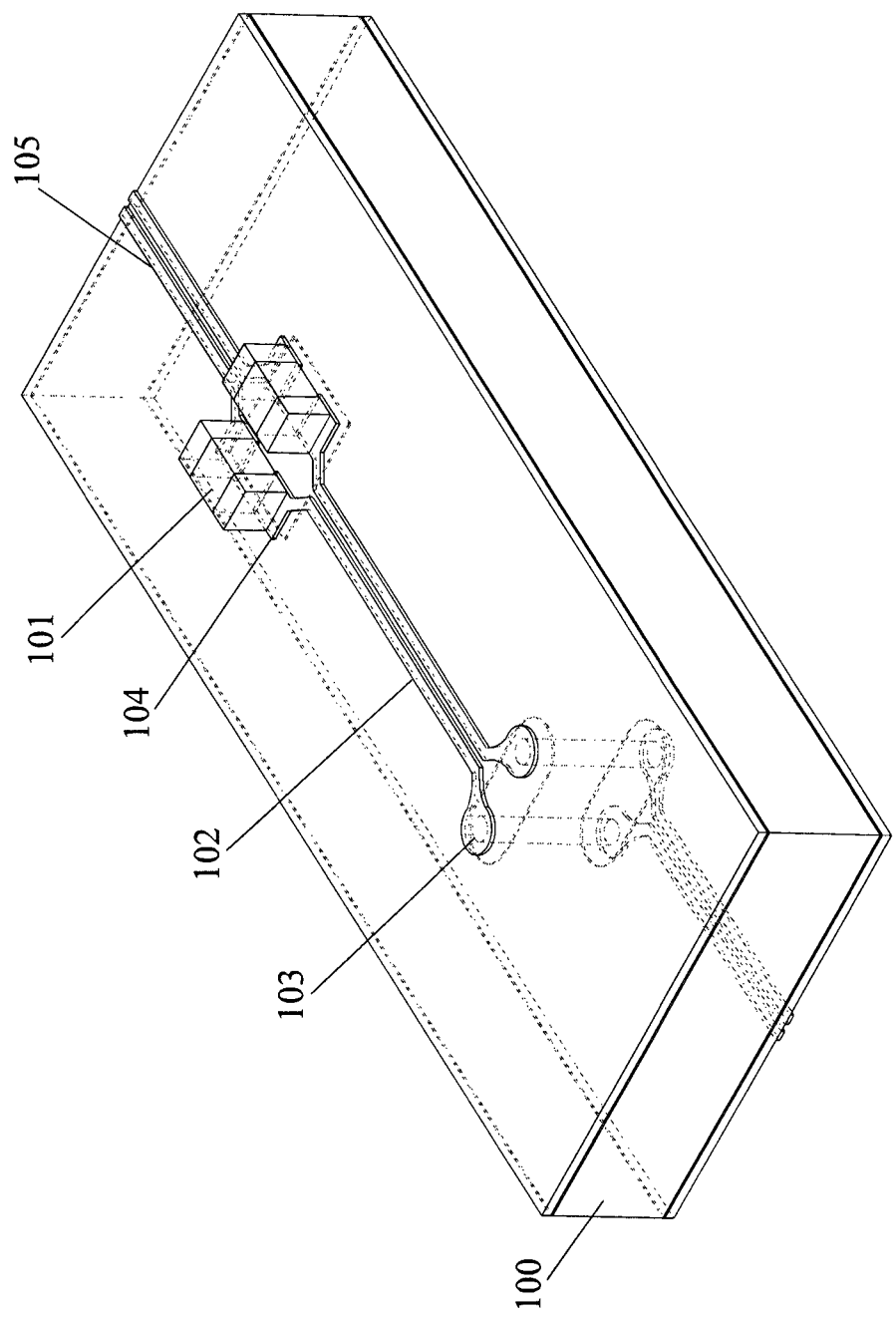
FIG. 1 is a perspective view of a conventional PCB.
Figure 6A:
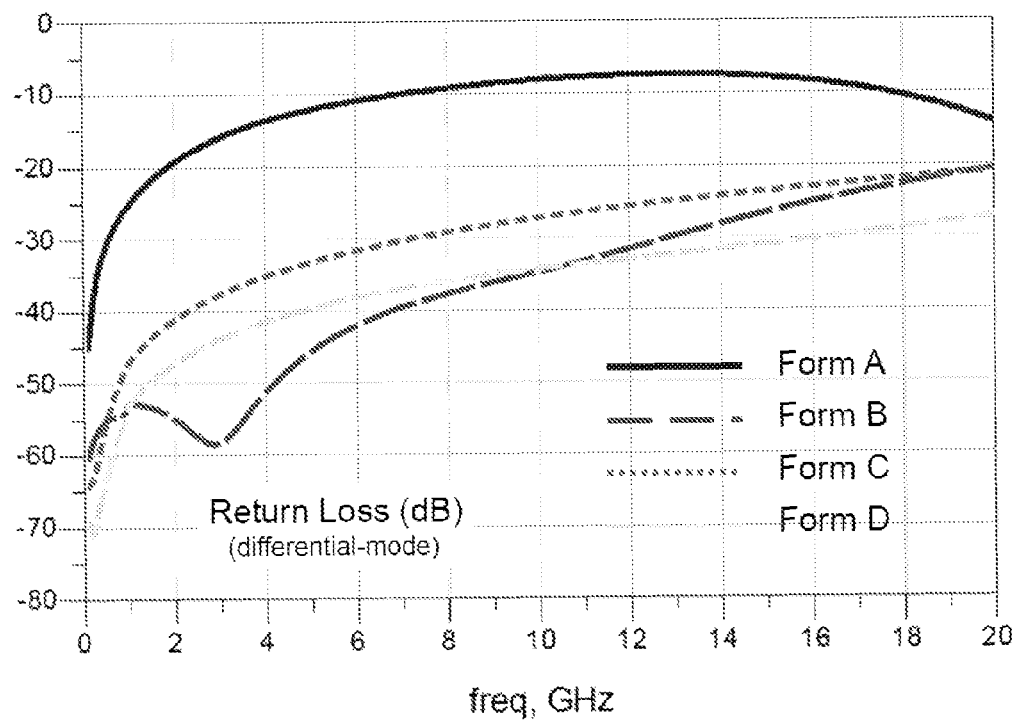
FIG. 6A illustrates the differential mode return loss of the PCB according to conventional designs and various embodiments of the present patent application.
Figure 6B:
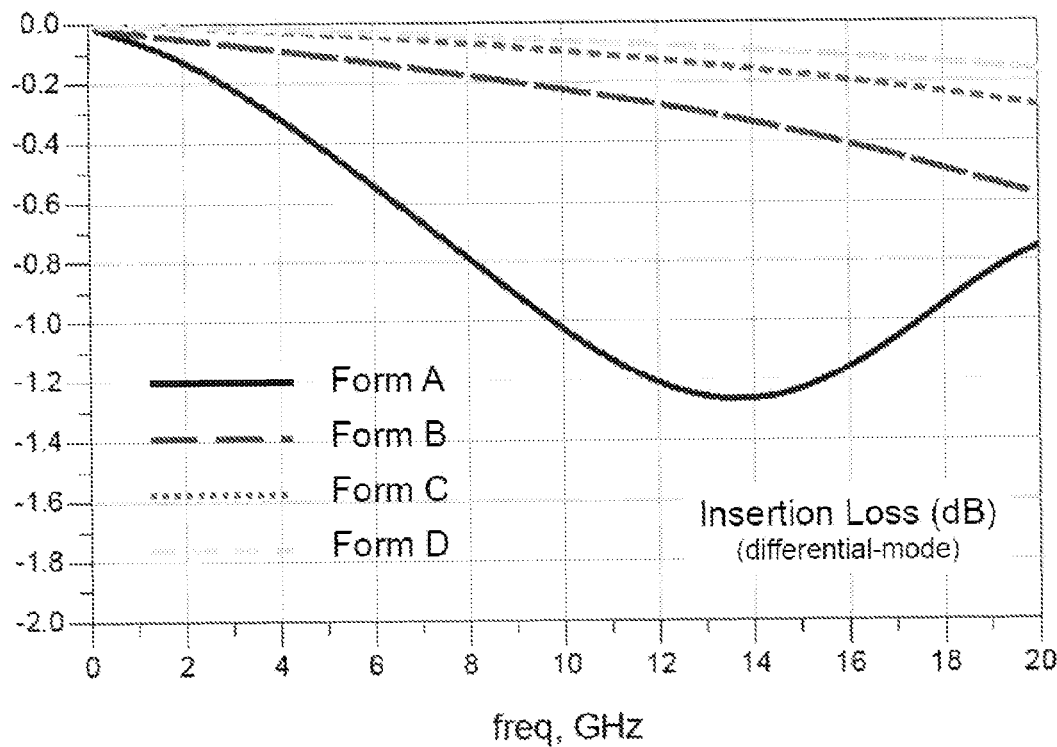
FIG. 6B illustrates the differential mode insertion loss of the PCB according to conventional designs and various embodiments of the present patent application.

FIG. 6A illustrates the differential mode return loss of the PCB according to conventional designs and various embodiments of the present patent application. FIG. 6B illustrates the differential mode insertion loss of the PCB according to conventional designs and various embodiments of the present patent application. Referring to FIG. 6A and FIG. 6B, among the results, the curves marked as "Form A" and "Form B" correspond to test results of the PCB according to conventional designs such as the one shown in FIG. 1; the curve marked as "Form C" corresponds to the PCB illustrated in FIG. 3; the curve marked as "Form D" corresponds to the PCB illustrated in FIGS. 2A-2C. FIG. 6A shows that the reflections at the through-hole vias are lower in Form C and Form D than in Form A and Form B while smaller reflections will cause less distortion to the signal. Compared with Form B, the return loss of Form D is higher at lower frequencies but lower at higher frequencies. FIG. 6B shows more power gets transmitted with the PCB in Form C and Form D than in Form A and Form B and less attenuation happens to the intended signal in Form C and Form D. Compared with Form C, Form D has a better insertion loss performance.

It is noted that with the presence of ground vias, common-mode return loss and insertion loss are also improved (data not shown in FIGS. 6A-6B), which ensures that less electromagnetic (EM) radiation will be generated when common-mode signal pass through the PCB structure.

By combining DC block capacitors and through-hole vias with the PCB trace configuration according to the embodiments of the present patent application, electrical discontinuities in the transmission lines provided by the PCB are reduced and the quality of the signal transmitted by the transmission lines is improved.

While the present patent application has been shown and described with particular references to a number of embodiments thereof, it should be noted that various other changes or modifications may be made without departing from the scope of the present invention.

What is claimed is:

1. A printed circuit board comprising:
   a first conductive layer comprising a first high-speed transmission line portion, two soldering pads, and two first stubs;
   a first insulating layer disposed under the first conductive layer;
   a second conductive layer disposed under the first insulating layer;
   a second insulating layer disposed under the second conductive layer;
   a third conductive layer disposed under the second insulating layer;
   a third insulating layer disposed under the third conductive layer;
   a fourth conductive layer disposed under the third insulating layer and comprising two connecting portions, two second stubs, and a second high-speed transmission line portion directly connected to the two connecting portions;
   two through-hole vias and two ground vias respectively disposed across the first insulating layer, the second conductive layer, the second insulating layer, the third conductive layer, and the third insulating layer; and
   two capacitors respectively connecting the first high-speed transmission line portion and the two soldering pads;
   wherein:
   the two through-hole vias are directly connected with the two soldering pads and extending the connection to the two connecting portions respectively;
   the two ground vias are physically and electrically connected with the two first stubs and the two second stubs, and electrically connected with the second conductive layer and the third conductive layer respectively; and
   two windows are respectively defined in the second conductive layer and the third conductive layer in the vicinity of where the through-hole vias pass through so that the through-hole vias are physically and electrically isolated from the second conductive layer and the third conductive layer; the window in the second conductive layer extends to an area under the two soldering pads in the first conductive layer;
   wherein the first and the second high-speed transmission line portions are differential pair type of microstrip lines; and
   wherein the edge-to-edge separation between the soldering pads in the first conductive layer is about 0.2 mm to about 0.3 mm, and the thickness of the first, the second, and the third insulating layers is about 0.1 mm or less respectively.

2. The PCB of claim 1, wherein the two capacitors are surface mount DC block capacitors, the second and the third conductive layers are layers of the electrical ground level with respect to the high-speed transmission line portions.

3. The PCB of claim 1, wherein the first conducting layer further comprises two additional soldering pads being disposed at an end of the first high-speed transmission line portion, and configured to physically and electrically connect the first high-speed transmission line portion and the capacitors.

4. The PCB of claim 1, wherein the soldering pads in the first conductive layer and the connecting portions in the fourth conductive layer are respectively merged into end portions of the through-hole vias, the end portions of the through-hole vias being circular pads.

5. A printed circuit board comprising: a first conductive layer comprising a first high-speed transmission line portion and two soldering pads;
   a first insulating layer disposed under the first conductive layer;
   a second conductive layer disposed under the first insulating layer;
   a second insulating layer disposed under the second conductive layer;
   a third conductive layer disposed under the second insulating layer;
   a third insulating layer disposed under the third conductive layer;
   a fourth conductive layer disposed under the third insulating layer and comprising two connecting portions and a second high-speed transmission line portion directly connected to the two connecting portions;
   two through-hole vias respectively disposed across the first insulating layer, the second conductive layer, the second insulating layer, the third conductive layer, and the third insulating layer; and
   two capacitors respectively connecting the first high-speed transmission line portion and the two soldering pads;
   wherein:
   the two through-hole vias are directly connected with the two soldering pads and extending the connection to the two connecting portions respectively;
   two windows are respectively defined in the second conductive layer and the third conductive layer in the vicinity of where the through-hole vias pass through so that the through-hole vias are physically and electrically isolated from the second conductive layer and the third conductive layer; the window in the second conductive layer extends to an area under the two soldering pads in the first conductive layer; and
   wherein the first and the second high-speed transmission line portions are differential pair type of microstrip lines.

6. The PCB of claim 5 further comprising at least two ground vias respectively disposed across the second insulating layer and electrically connected with the second conductive layer and the third conductive layer and not extending beyond the second conductive layer and the third conductive layer.

7. The PCB of claim 6, wherein the first conductive layer further comprises at least two first stubs, the fourth conductive layer further comprises at least two second stubs, the at least two ground vias are respectively disposed across the first insulating layer, the second conductive layer, the third conductive layer, and the third insulating layer, and electrically connected with the at least two first stubs and the at least two second stubs.

8. The PCB of claim 5, wherein the first and the second high-speed transmission line portions are coplanar waveguides, respectively comprising a top surface ground plane and a bottom surface ground plane.

9. The PCB of claim 8 further comprising at least two ground vias respectively disposed across the first insulating layer, the second conductive layer, the second insulating layer, the third conductive layer, and the third insulating layer, and electrically connected with the top surface ground plane, the bottom surface ground plane, the second conductive layer, and the third conductive layer.

10. The PCB of claim 5, wherein the two capacitors are surface mount DC block capacitors, the second and the third conductive layers are layers of the electrical ground level with respect to the high-speed transmission line portions.

11. The PCB of claim 5, wherein the soldering pads in the first conductive layer and the connecting portions in the fourth conductive layer are respectively merged into end portions of the through-hole vias, the end portions of the through-hole vias being circular pads.

12. The PCB of claim 5, wherein the edge-to-edge separation between the soldering pads in the first conductive layer is about 0.2 mm to about 0.3 mm, and the thickness of the first, the second, and the third insulating layers is about 0.1 mm or less respectively.

13. A printed circuit board comprising:
a first conductive layer comprising a first high-speed transmission line portion and two soldering pads;
a first insulating layer disposed under the first conductive layer;
a fourth conductive layer disposed under the first insulating layer and comprising a second high-speed transmission line portion;
two through-hole vias respectively disposed across the first insulating layer; and
two capacitors respectively connecting the first high-speed transmission line portion and the two soldering pads; wherein:
the two through-hole vias are directly connected with the two soldering pads and extending the connection to the second high-speed transmission line portion respectively;
wherein the first and the second high-speed transmission line portions are differential pair type of microstrip lines; and
the edge-to-edge separation between the soldering pads in the first conductive layer is about 0.2 mm to about 0.3 mm and the thickness of the first layer is about 0.1 mm or less respectively.

14. The PCB of claim 13, further comprising a second conductive layer disposed under the first insulating layer; a second insulating layer disposed under the second conductive layer;
a third conductive layer disposed under the second insulating layer; and a third insulating layer disposed under the third conductive layer, wherein two windows are respectively defined in the second conductive layer and the third conductive layer in the vicinity of where the through-hole vias pass through so that the through-hole vias are electrically isolated from the second conductive layer and the third conductive layer.

15. The PCB of claim 14, wherein the window in the second conductive layer extends to an area under the two soldering pads in the first conductive layer.

16. The PCB of claim 13, wherein the first and the second high-speed transmission line portions are coplanar waveguides, respectively comprising a top surface ground plane and a bottom surface ground plane.

17. The PCB of claim 16 further comprising at least two ground vias respectively disposed across the first insulating layer, and electrically connected with the top surface ground plane and the bottom surface ground plane.

18. The PCB of claim 13, wherein the soldering pads in the first conductive layer and the second high-speed transmission line portion in the fourth conductive layer are respectively merged into end portions of the through-hole vias, the end portions of the through-hole vias being circular pads.

* * * * *